(12) United States Patent
Bailey, III et al.

(10) Patent No.: US 7,009,281 B2
(45) Date of Patent: Mar. 7, 2006

(54) SMALL VOLUME PROCESS CHAMBER WITH HOT INNER SURFACES

(75) Inventors: Andrew D. Bailey, III, Pleasanton, CA (US); Tuqiang Ni, Pleasanton, CA (US)

(73) Assignee: Lam Corporation, Fremont, CA (US)

( * ) Notice: Subject to any disclaimer, the term of this patent is extended or adjusted under 35 U.S.C. 154(b) by 101 days.

(21) Appl. No.: 10/744,355

(22) Filed: Dec. 22, 2003

(65) Prior Publication Data

US 2005/0070105 A1 Mar. 31, 2005

Related U.S. Application Data

(63) Continuation-in-part of application No. 10/390,520, filed on Mar. 14, 2003, now Pat. No. 6,821,899, and a continuation-in-part of application No. 10/390,117, filed on Mar. 14, 2003, now Pat. No. 6,939,796.

(51) Int. Cl.
 *H01L 23/58* (2006.01)
(52) U.S. Cl. .................. 257/642; 438/680; 257/635; 257/636; 257/637; 257/638; 257/639; 257/640; 250/424; 156/345.24
(58) Field of Classification Search .............. 438/680; 257/635, 513, 624; 250/424; 156/345.24
See application file for complete search history.

(56) References Cited

U.S. PATENT DOCUMENTS

| | | | |
|---|---|---|---|
| 4,985,113 A | 1/1991 | Fujimoto et al. | |
| 5,009,738 A | 4/1991 | Gruenwald et al. | |
| 5,098,516 A | 3/1992 | Norman et al. | |
| 5,198,677 A | * 3/1993 | Leung et al. | ............... 250/424 |
| 5,200,031 A | 4/1993 | Latchford et al. | |
| 5,256,565 A | 10/1993 | Bernhardt et al. | |
| 5,302,241 A | 4/1994 | Cathey, Jr. | |
| 5,380,397 A | 1/1995 | Fukuyama et al. | |
| 5,387,315 A | 2/1995 | Sandhu | |
| 5,534,751 A | 7/1996 | Lenz et al. | |
| 5,556,714 A | 9/1996 | Fukuyama et al. | |
| 5,744,402 A | 4/1998 | Fukazawa et al. | |
| 5,770,100 A | 6/1998 | Fukuyama et al. | |
| 5,968,847 A | 10/1999 | Ye et al. | |
| 6,004,188 A | 12/1999 | Roy | |
| 6,008,130 A | 12/1999 | Henderson et al. | |
| 6,051,496 A | 4/2000 | Jang | |
| 6,056,864 A | 5/2000 | Cheung | |
| 6,083,822 A | 7/2000 | Lee | |
| 6,096,230 A | 8/2000 | Scatz et al. | |
| 6,133,144 A | 10/2000 | Tsai et al. | |

(Continued)

FOREIGN PATENT DOCUMENTS

EP 1 041 614 A1 10/2000

(Continued)

OTHER PUBLICATIONS

TEGAL Corporation, "Enabling a Wireless World", p. 1, http://www.tegal.com/.

(Continued)

*Primary Examiner*—Mai-Huong Tran
(74) *Attorney, Agent, or Firm*—Martine Penilla and Gencarella LLP

(57) ABSTRACT

A system and method of processing a substrate including loading a substrate into a plasma chamber and setting a pressure of the plasma chamber to a pre-determined pressure set point. Several inner surfaces that define a plasma zone are heated to a processing temperature of greater than about 200 degrees C. A process gas is injected into the plasma zone to form a plasma and the substrate is processed.

7 Claims, 10 Drawing Sheets

U.S. PATENT DOCUMENTS

| | | | |
|---|---|---|---|
| 6,140,226 A | 10/2000 | Grill et al. | |
| 6,147,005 A | 11/2000 | Tu et al. | |
| 6,153,116 A | 11/2000 | Yang et al. | |
| 6,153,530 A | 11/2000 | Ye et al. | |
| 6,174,813 B1 | 1/2001 | Wang | |
| 6,184,128 B1 | 2/2001 | Wang et al. | |
| 6,221,775 B1 | 4/2001 | Ference et al. | |
| 6,227,140 B1 | 5/2001 | Kennedy et al. | |
| 6,234,870 B1 | 5/2001 | Uzoh et al. | |
| 6,313,025 B1 | 11/2001 | Chittipeddi et al. | |
| 6,323,121 B1 | 11/2001 | Liu et al. | |
| 6,331,380 B1 | 12/2001 | Ye et al. | |
| 6,350,364 B1 | 2/2002 | Jang | |
| 6,350,664 B1 | 2/2002 | Haji et al. | |
| 6,352,081 B1 | 3/2002 | Lu et al. | |
| 6,365,327 B1 | 4/2002 | Chittipeddi et al. | |
| 6,368,517 B1 | 4/2002 | Hwang et al. | |
| 6,383,935 B1 | 5/2002 | Lin et al. | |
| 6,408,786 B1 | 6/2002 | Kennedy et al. | |
| 6,417,093 B1 | 7/2002 | Xie et al. | |
| 6,423,200 B1 | 7/2002 | Hymes | |
| 6,440,840 B1 | 8/2002 | Chen | |
| 6,448,176 B1 | 9/2002 | Grill et al. | |
| 6,475,298 B1 | 11/2002 | O'Donnell et al. | |
| 6,479,391 B1 | 11/2002 | Morrow et al. | |
| 6,482,331 B1 | 11/2002 | Lu et al. | |
| 6,482,755 B1 | 11/2002 | Ngo et al. | |
| 6,486,059 B1 | 11/2002 | Lee et al. | |
| 6,500,357 B1 | 12/2002 | Luo et al. | |
| 6,517,413 B1 | 2/2003 | Hu et al. | |
| 6,527,911 B1 | 3/2003 | Yen et al. | |
| 6,559,049 B1 | 5/2003 | Chen et al. | |
| 6,573,187 B1 | 6/2003 | Chen et al. | |
| 6,576,550 B1 | 6/2003 | Brase et al. | |
| 6,579,800 B1 | 6/2003 | Basol et al. | |
| 6,582,974 B1 | 6/2003 | Lui et al. | |
| 6,600,229 B1 | 7/2003 | Mukherjee et al. | |
| 6,617,232 B1 | 9/2003 | Kim et al. | |
| 6,620,726 B1 | 9/2003 | Preusse et al. | |
| 6,630,413 B1 | 10/2003 | Todd | |
| 6,653,224 B1 | 11/2003 | Gotkis et al. | |
| 6,767,829 B1 * | 7/2004 | Akahori | 438/680 |
| 2001/0003060 A1 | 6/2001 | Yokohama et al. | |
| 2001/0015175 A1 | 8/2001 | Masuda et al. | |
| 2001/0018271 A1 | 8/2001 | Yanagisawa | |
| 2001/0054381 A1 | 12/2001 | Umotoy et al. | |
| 2002/0016084 A1 | 2/2002 | Todd | |
| 2002/0045354 A1 | 4/2002 | Ye et al. | |
| 2002/0081854 A1 | 6/2002 | Morrow et al. | |
| 2002/0121500 A1 | 9/2002 | Annapragada et al. | |
| 2002/0124867 A1 | 9/2002 | Kim et al. | |
| 2002/0153350 A1 | 10/2002 | Lu et al. | |
| 2002/0155695 A1 | 10/2002 | Lee et al. | |
| 2002/0175071 A1 | 11/2002 | Hymes | |
| 2002/0182853 A1 | 12/2002 | Chen et al. | |
| 2002/0187627 A1 | 12/2002 | Yuang | |
| 2002/0192957 A1 | 12/2002 | Chien et al. | |
| 2002/0192966 A1 | 12/2002 | Shanmugasundram et al. | |
| 2003/0013316 A1 | 1/2003 | Kim et al. | |
| 2003/0029567 A1 | 2/2003 | Dhindsa et al. | |
| 2003/0032278 A1 | 2/2003 | Chen et al. | |
| 2003/0044375 A1 | 3/2003 | Nguyen et al. | |
| 2003/0044725 A1 | 3/2003 | Hsue et al. | |
| 2003/0045100 A1 | 3/2003 | Saka et al. | |
| 2003/0057179 A1 | 3/2003 | Luo et al. | |
| 2003/0073319 A1 | 4/2003 | Basol et al. | |
| 2003/0082996 A1 | 5/2003 | Fortin et al. | |
| 2003/0087586 A1 | 5/2003 | Kaushal et al. | |
| 2003/0092260 A1 | 5/2003 | Lui et al. | |
| 2003/0119305 A1 | 6/2003 | Huang et al. | |
| 2003/0159779 A1 * | 8/2003 | Sago et al. | |
| 2003/0164354 A1 | 9/2003 | Hsieh et al. | |
| 2003/0166345 A1 | 9/2003 | Chang | |
| 2003/0184732 A1 | 10/2003 | Katz et al. | |
| 2003/0186546 A1 | 10/2003 | Wollstein et al. | |
| 2003/0196989 A1 | 10/2003 | Zhou et al. | |
| 2003/0199112 A1 | 10/2003 | Shanmugasundram et al. | |
| 2003/0203321 A1 | 10/2003 | Ma et al. | |
| 2003/0211746 A1 | 11/2003 | Chen et al. | |
| 2003/0213558 A1 | 11/2003 | Basol et al. | |
| 2003/0224596 A1 | 12/2003 | Marxsen et al. | |
| 2004/0242012 A1 | 12/2004 | Ikeda | |

FOREIGN PATENT DOCUMENTS

| | | |
|---|---|---|
| EP | 1 081 751 A2 | 3/2001 |
| EP | 1 320 128 A1 | 6/2003 |
| JP | 07230993 | 8/1995 |
| JP | 07235543 | 9/1995 |
| JP | 11 067766 | 3/1999 |
| WO | WO 99/46812 | 9/1999 |
| WO | WO 00/03426 | 1/2000 |
| WO | WO 00/59005 | 10/2000 |
| WO | WO 01/88229 | 11/2001 |
| WO | WO 02/37541 A2 | 5/2002 |
| WO | WO 03/026004 | 3/2003 |
| WO | WO 03/058703 | 7/2003 |

OTHER PUBLICATIONS

TEGAL Corporation, "Corporate Information", pp. 1-7, http://www.tegal.com/corp/corpinfo.html.

TEGAL Corporation, "Products and Services", p. 1, http://www.tegal.com/prod_srvcs/products_serv.html.

TEGAL Corporation, "Products and Services, 6500 Hre Series", pp. 1-3, http://www.tegal.com/prod_srvcs/6500_prod.html.

TEGAL Corporation, "Products and Services, 900 Series", pp. 1-4, http://www.tegal.com/prod_srvcs/900_prod.html.

TEGAL Corporation, "Products and Services, Tegal i90X—The Next Generation in Plasma Etch Technology", pp. 1-4, http://www.tegal.com/prod_srvcs/i90x_data_sheet.html.

Y. Oshita, N. Howi, "Lower temperature plasma etching of Cu using IR light irradiation", Thin Solid Films, 1995.

Lynn R. Allen, John M. Grant, "Tungsten plug etchback and substrate damage measured by atomic force microscopy", J. Vac. Sci Technol. May/Jun 1995 pp 918-922.

William F. Marx, Yunju Ra, Richard Yang, Ching-Hwa Chen, "Plasma and processing effects of electrode spacing for tungsten etchback using a bipolar electrostatic wafer clamp", J. Vac. Sci Technol. Nov/Dec 1994 pp 3087-3090.

J. Farkas, K.-M. Chi, M.J. Hampden-Smith, T.T. Kodas, "Low-temperature copper etching via reactions with $Cl_2$ and $Pet_3$ under ultrahigh vacuum conditions", J. Appl. Phys, Feb. 1993, pp 1455-1460.

Seongju Park, T.N. Rhodin, L.C. Rathbun, "Halide formation and etching of Cu thin films with $Cl_2$ and $Br_2$", J. Vac. Sci Technol., Mar/Apr 1986, pp 168-172.

Lynn R. Allen, "Tungsten Plug Etchback In A TCP Etcher", Sharp Microelectronics Technology, Inc., pp 255-263.

N. Hosoi, Y. Ohshita, "Plasma Etching Of Copper Films Using IR Light Irradiation", Mat. Res. Soc. Symp. Proc. vol. 337, 1994, pp 201-205.

TEGAL Corporation, "Enablilng a Wireless World", p. 1, http://www.tegal.com/.

TEGAL Corporation, "Corporate Information", pp. 1-7, http://www.tegal.com/corp/corpinfo.html.

TEGAL Corporation, "Products and Services", p. 1, http://www.tegal.com/prod_srvcs/products_serv.html.

TEGAL Corporation, "Products and Services, 6500 Hre Series", pp. 1-3, http://www.tegal.com/prod_srvcs/6500₁₃ prod.html.

TEGAL Corporation, "Products and Services, 900 Series", pp. 1-4, http://www.tegal.com/prod_srvcs/900_prod.html.

TEGAL Corporation, "Products and Services, Tegal i90X—The Next Generation in Plasma Etch Technology", pp. 1-4, http://www.tegal.com/prod₁₃ srvcs/i90x_data_sheet.html.

Nagraj S. Kulkrani, Robert T. DeHoff, "Application of Volatility Diagrams for Low Temperature, Dry Etching, and Planarization of Copper", Journal of The Electromechanical Society, 2002, pp G620-G632.

Kazuhide Ohno, Masaaki Sato, Yoshinobu Arita, "Reactive Ion Etching of Copper Films in $SiCl_4$ and $N_2$ Mixture", Japanese Journal of Applied Physics, Jun. 1989, No. 6, Part 2, pp 1070-1072.

K. Mosig, T. Jacobs, P. Kofron, M. Daniels, K. Brennan, A. Gonzales, R. Augur, J. Wetzel, R. Havemann, A. Shiota, "Single and Dual Damascene Integration of a Spin-on Porous Ultra low-k Material", *IEEE,* 2001 pp. 292-294.

David T. Price, Ronald J. Gutmann, Shyam P. Murarka, "Damascene copper internconnects with polymer ILDs", 1997 Thin Solids Films, pp. 523-528.

* cited by examiner

SMALL VOLUME PROCESS CHAMBER WITH HOT INNER SURFACES

CROSS REFERENCE TO RELATED APPLICATIONS

This application is a continuation-in-part and claims priority from U.S. patent application Ser. No. 10/390,520 filed on Mar. 14, 2003 now U.S. Pat. No. 6,821,899 and entitled "System, Method and Apparatus for Improved Local Dual-Damascene Planarization," which is incorporated herein by reference in its entirety. This application is a continuation-in-part and claims priority from U.S. patent application Ser. No. 10/390,117 filed on Mar. 14, 2003 now U.S. Pat No. 6,939,796, and entitled "System, Method and Apparatus for Improved Global Dual-Damascene Planarization," which is incorporated herein by reference in its entirety.

BACKGROUND OF THE INVENTION

1. Field of the Invention

The present invention relates generally to etching semiconductor substrates, and more particularly, to systems and methods for plasma etching semiconductor substrates.

2. Description of the Related Art

In general, the manufacturing of the integrated circuit devices (in the form of semiconductor substrates and wafers) includes the use of plasma etching chambers. The plasma etch chambers are capable of etching selected layers on the substrate as defined by a photoresist mask. The plasma etch chambers are configured to receive processing gases (i.e., etch chemistries) while a radio frequency (RF) power is applied to one or more electrodes of the plasma etch chamber. The pressure inside the plasma etch chamber is also controlled for the particular process. Upon applying the desired RF power to the electrode(s), the process gases in the chamber are activated such that a plasma is created. The plasma is thus configured to perform the desired etching of the selected layers of the semiconductor wafer.

Low volatility byproducts are produced in some prior art plasma etch processes. By way of example, in a copper etch process using chlorine containing gases (e.g., Cl2 and HCl), the byproduct is CuClx. CuClx is non-volatile at room temperature. The low-volatility byproducts typically condense on the chamber walls. During each plasma etch cycle, the byproducts build-up on the chamber walls. Eventually the byproducts build-up to a certain thickness. The byproduct build-up then begins to "flake" off of the chamber walls and is therefore becomes a significant particle source. The particles can contaminate the substrates being etched in the chamber.

Recognizing that the internal surfaces of the plasma etch chamber are exposed to the plasma, the chambers are often designed to permit the use of simple lining parts, such as, disks, rings, and cylinders. Because these lining parts are configured to confine the plasma over the substrate being processed, these parts are continuously exposed and attacked by the processing plasma energies. Due to this exposure, these parts ultimately erode or accumulate polymer buildup, requiring replacement or thorough cleaning. However, the cleaning and/or replacement costs of these lining parts can become very expensive both in actual cost and in lost production time required for the cleaning and replacement.

In view of the foregoing, there is a need for a system and method of substantially eliminating particle contamination from byproduct build-up on the walls of the plasma etch chamber.

SUMMARY OF THE INVENTION

Broadly speaking, the present invention fills these needs by providing an improved system for processing a substrate. It should be appreciated that the present invention can be implemented in numerous ways, including as a process, an apparatus, a system, computer readable media, or a device. Several inventive embodiments of the present invention are described below.

One embodiment includes a method of processing a substrate. The method including loading a substrate into a plasma chamber and setting a pressure of the plasma chamber to a pre-determined pressure set point. Multiple inner surfaces that define a plasma zone are heated to a processing temperature. A process gas is injected into the plasma zone to form a plasma and the substrate is processed. The processing temperature can be greater than about 200 degrees (e.g., between about 200 degrees C. and about 400 degrees C. or a higher temperature).

The method further includes drawing a byproduct vapor from the plasma zone through a cold trap to condense the byproduct vapor in the cold trap. The cold trap has a temperature of at least about 50 degrees C. cooler than the processing temperature.

Processing the substrate can include etching the substrate. Processing the substrate can also include etching a copper film on the substrate. Heating the inner surfaces defining the plasma zone to the processing temperature can include maintaining a surface of the substrate at a second temperature sufficient to cause a byproduct vapor to condense on the surface of the substrate to deposit a film on the substrate. The second temperature is about 50 degrees C. cooler than the processing temperature.

The pre-determined pressure set point is less than atmospheric pressure. The pre-determined pressure set point is within a range of about 1 mTorr and about 500 mTorr.

The plasma chamber is a small volume plasma chamber. The small volume plasma chamber includes a first electrode. The first electrode forming a chuck for supporting the substrate. A second electrode is also included. The second electrode being deposed substantially parallel to the first electrode. The second electrode being one of the inner surfaces. The first electrode and second electrode being separated by a predetermined distance. The predetermined distance is equal to a range of between about 0.5 cm and about 5 cm. The small volume plasma chamber includes a hot liner, wherein the hot liner forms a portion of the plurality of inner surfaces.

Processing the substrate includes a stress free planarization wherein the substrate is patterned, having a conductive interconnect material filling multiple features in the pattern. The conductive interconnect material having an overburden portion having at least one non-uniformity. The stress free planarization includes planarizing the overburden portion that includes depositing an additional layer on the overburden portion and planarizing the additional layer and the overburden portion. The additional layer being substantially entirely removed in the planarizing process.

Another embodiment provides a small volume plasma chamber that includes a first electrode, the first electrode forming a chuck for supporting the substrate. A second electrode is also included. The second electrode being deposed substantially parallel to the first electrode. The first electrode and second electrode being separated by a predetermined distance. A hot liner is also included. The hot liner and the second electrode form a portion of several inner surfaces that define a plasma zone. The predetermined distance is equal to a range of between about 0.5 cm and about 5 cm.

The small volume plasma chamber can also include a cold trap. The cold trap being sufficiently cooler than the inner surfaces that define the plasma zone to substantially cause a plasma byproduct vapor to condense in the cold trap. The cold trap is coupled to the plasma zone by a passage.

Another embodiment provides a method of forming a semiconductor device including loading a patterned substrate into a plasma chamber. The substrate having a conductive interconnect material filling several features in the pattern. The conductive interconnect material having an overburden portion having at least one non-uniformity. A pressure of the plasma chamber is set to a pre-determined pressure set point. Multiple inner surfaces that define a plasma zone, are heated to a processing temperature of greater than about 200 degree C. A process gas is injected into the plasma zone to form a plasma. The substrate is processed which includes forming an additional layer on the overburden portion and planarizing the additional layer and the overburden portion. The additional layer being substantially entirely removed in the planarizing process. A byproduct vapor from the plasma zone is drawn through a cold trap to cause the byproduct vapor to condense in the cold trap. The conductive interconnect material can include copper.

The present invention provides a small volume plasma chamber having multiple inner surfaces capable of being substantially uniformly heated to a processing temperature to ensure that byproduct vapors, especially byproduct vapors having a low volatility, will not condense on the inner surfaces so as to form particle contamination sources.

Further, the byproduct vapors are drawn away from the plasma zone and through a cold trap where the byproduct vapors can condense. The cold trap is sufficiently physically isolated that particles formed by the condensed byproduct vapors are substantially prevented from migrating to the substrate being processed.

The present invention provides an advantage of substantially minimizing the particle generation and resulting substrate contamination. This is achieved by substantially eliminating condensation of plasma chemistries on the inner surfaces of the plasma chamber. Condensation is directed in a cold trap that is at least partially physically isolated from the plasma zone.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for an improved system and method for performing a plasma etch process on a substrate will now be described. It will be apparent to those skilled in the art that the present invention may be practiced without some or all of the specific details set forth herein.

One embodiment provides a plasma etch chamber with a relatively small volume that includes a capacitively coupled RF source. The inner surface area of the small volume plasma etch chamber is sufficiently small that the inner surface area can be easily heated to an elevated temperature (e.g., greater than about 200 degrees C.). The elevated temperature is sufficient to substantially prevent a low volatility byproduct from condensing on the inner surface. The capacitively coupled RF plasma chamber uses parallel plates having a narrow gap between them. The parallel plates form a top and bottom electrodes with the substrate situated on the bottom electrode and the top electrode situated very close to the surface of the substrate. In this configuration, the top and bottom electrodes form a majority of the inner surface area.

Figure 1A:
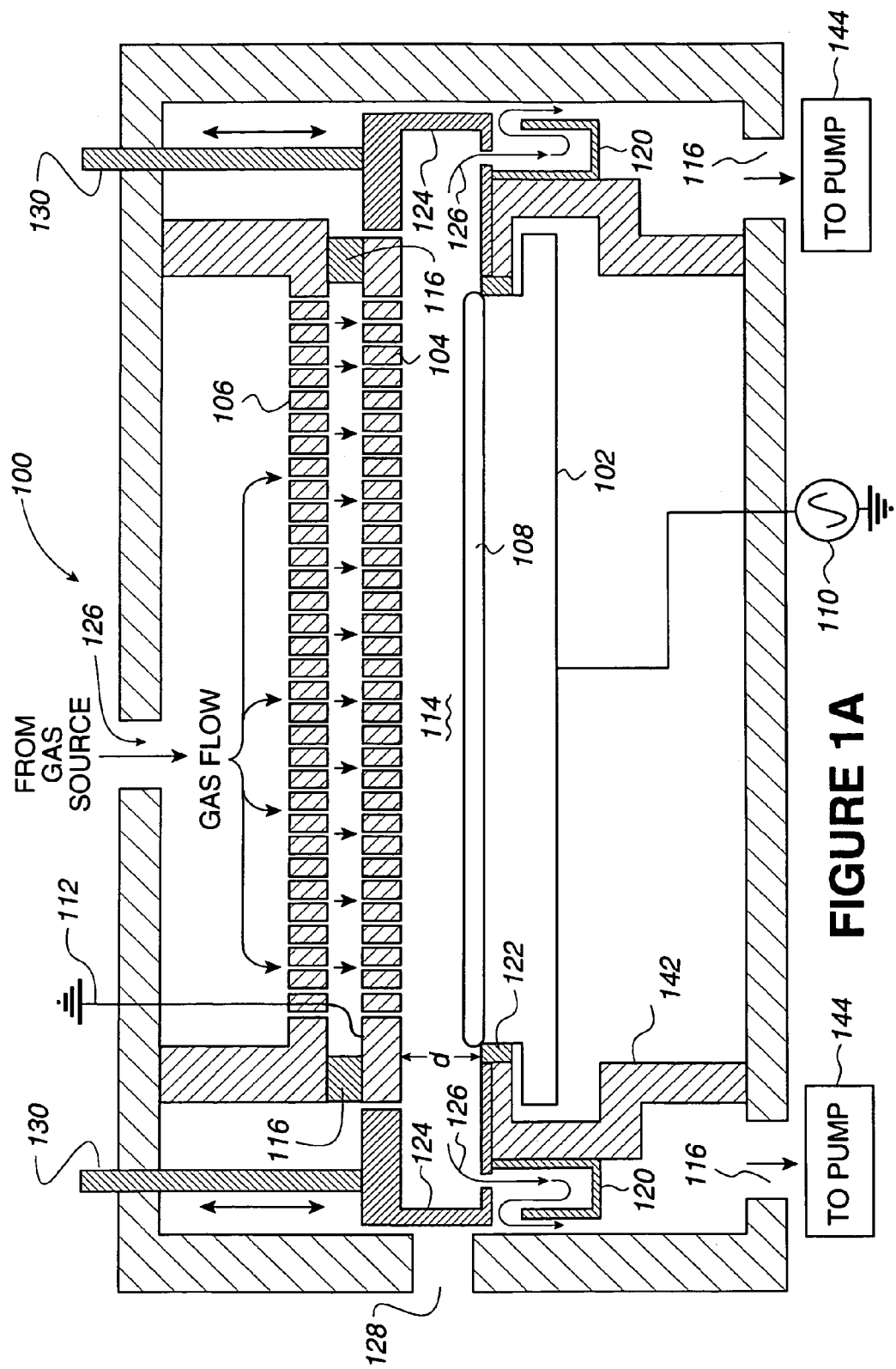
FIG. 1A shows side view of a small volume plasma etch process chamber, in accordance with one embodiment of the present invention.

FIG. 1A shows side view of a small volume plasma etch process chamber 100, in accordance with one embodiment of the present invention. A substrate 108 being processed is clamped to a heated chuck 102 that also serves as the bottom electrode. The chuck 102 can be an electro-static chuck. A focus ring 122 can also be included in the bottom electrode.

Process gases are delivered from a gas source trough an inlet port 126. The process gases flow through an optional baffle plate 106 and through a perforated "showerhead-type"

top electrode 104. The baffle plate 106 disperses the gas flow. The baffle plate 106 can be separated from the top electrode 104 by a low contact dielectric 116 (e.g., quartz, insulator, etc.) so that the baffle plate 106 is not substantially connected to the tope electrode 104 either electrically or thermally. A plasma zone 114 is formed by the volume defined by the top electrode 104, the bottom electrode 102 and the hot liner 124. The gas flow is well dispersed in the plasma zone 114.

The top electrode 104 and the bottom electrode 102 are separated by a distance d of about 0.5 cm to about 5 cm. In one exemplary embodiment, d is equal to about 2 cm. The top electrode 104 can be coupled to a ground potential 112 and the bottom electrode 102 coupled to the RF source 110 as shown. In an alternative embodiment, the bottom electrode 102 can be coupled to the ground potential 112 and the top electrode 104 coupled the RF source 110. The RF source can have a frequency of between about 400 kHz and about 60 MHz. The RF source can have a voltage of between about 100 volts and about 2000 volts.

In an alternative embodiment, the plasma chamber 100 can be configured in a push-pull configuration. In the push-pull configuration, both the top electrode 104 and the bottom electrode 102 are powered by the RF source. The sputtering from ions in the push-pull configuration can further reduce the deposition of the low-volatile by-products on the top electrode 104. As described above, the deposition of etch by-products on the top electrode 104 is a major concern since it is proximate to the surface substrate 108. The push-pull configuration plasma chamber 100 can also be powered from a single RF source 110. In this push-pull RF configuration, the plasma potential is reduced to one half, which allows the plasma to be more easily confined in the plasma zone 114.

The process gases can be heated by hot plasma bombardment. If a higher temperature is needed to prevent deposition of the byproducts on the inner surface area, then additional electric heaters can be embedded in the top electrode 104. A hot liner 124 between the electrodes is electrically heated to prevent any deposition on the liner. The hot liner 124 can be heated with embedded resistive heaters or other types of heat sources (e.g., hot oil, radiant heat source) The hot liner 124 can also serve as a plasma confinement barrier defining a plasma zone 114 formed between the top electrode 104, the bottom electrode 102 and the hot liner. The hot liner 124 can be manufactured from a plasma resistant material (e.g., quartz or alumina or any suitable materials coated with plasma resistant layers).

In an exemplary use, a copper film can be etched using a chlorine containing gaseous species. In such a use, the minimum temperature for all surfaces (e.g., hot liner 124, top electrode 104, and bottom electrode 102) that are around the substrate 108, should be between about 200 to about 400 degrees C. At that temperature range the etch byproducts (e.g., CuClx) and other chemistries in the plasma are vaporized at a sufficient vapor pressure and can therefore be pumped out of the plasma zone 114 in the plasma etch chamber and out of the outlet ports 116. As the temperature is increased, the volatility of the various chemistries and byproducts in the plasma also increases. As a result, vapors having a low volatility (e.g., copper etch byproducts) can be more efficiently evacuated from the plasma zone 114 as the temperature is increased. Because the low volatility copper etch byproducts are more effectively evacuated, then the particle generation caused by build-up of the etch byproduct on the inner surfaces of the plasma zone 114 is substantially reduced.

It should be understood that while 400 degrees C. is cited herein is an exemplary upper temperature limit, the chamber is not limited to 400 degrees C. and could be heated to a much higher temperature if desired. By way of example, if a particular etch by product did not have a sufficient vapor pressure until heated to 500 degrees C., then the process chamber could be sufficiently heated to 500 degrees C. Temperatures higher than 500 degrees C. can also be used.

In contrast, a typical prior art plasma etch chamber is too large to be effectively heated to 200 degrees C. and at least some portion of the inner surface of the prior art plasma etch chamber is sufficiently cool enough that the etch byproducts can condense and eventually build-up and flake off, thereby becoming a particle contamination source. The typical plasma etch processes occur at less than 100 degrees C. (e.g., 60 degrees C.) and as described above, the etch byproducts can condense on the inner surfaces, near the substrate, and cause particle contamination.

Because the etch byproduct CuClx has a low volatility, the plasma etch process can be accomplished at a pressure less than or equal to about atmospheric pressure (i.e. less than or equal to about 1 Torr). By way of example the copper plasma etch process can be operated at a range of about 1–500 mTorr.

A cold trap 120 is included adjacent to the hot liner 124. A narrow passage 126 through the hot liner 124 couples the plasma zone 114 with the cold trap 120. As gases and the etch byproduct vapor is pumped out of the plasma zone 114, the etch byproduct vapor is drawn through the cold trap 120 and drawn out the outlet ports 116 by one or more pumps 144. Much of the etch byproduct condenses in the cold trap 120. As a result, the etch byproduct gradually builds up on the surfaces of the cold trap 120. Any particles (e.g., flakes and other loose etch byproduct buildup) that form in the cold trap 120 cannot easily migrate back to the plasma zone 114, and therefore to the substrate 108, due to the relatively small width of the narrow passage 126. By way of example, the narrow passage 126 can have a width of between about 5 mm to about 20 mm. In this manner the particles are sufficiently physically separated from the substrate 108 to substantially eliminate particle contamination resulting from the plasma etch byproducts.

The cold trap 120 can be actively cooled or may simply not be heated and therefore sufficiently cool to cause the etch byproducts to condense. The cold trap 120 can be thermally isolated from the heated portions of the plasma chamber 100 so that the cold trap will remain substantially cooler than the heated portions (e.g., more than about 50 degrees C. cooler, for example, than the hot liner 120 and the substrate 108). By way of example the cold trap 120 can be thermally coupled to the wall of the chamber 100 or the chuck housing 142 so that the cold trap 120 will remain approximately the same temperature as the respective wall of the chamber 100 or the chuck housing 142.

The substrate 108 can be loaded in to the plasma etch chamber 100 via a loading port 128. The bottom electrode 1-2 can be lowered in the chuck housing 142 or the hot liner 124 can be lifted (e.g., by lifters 130) or combinations thereof to provide substrate loading and unloading access to the plasma zone 114.

Figure 1B:
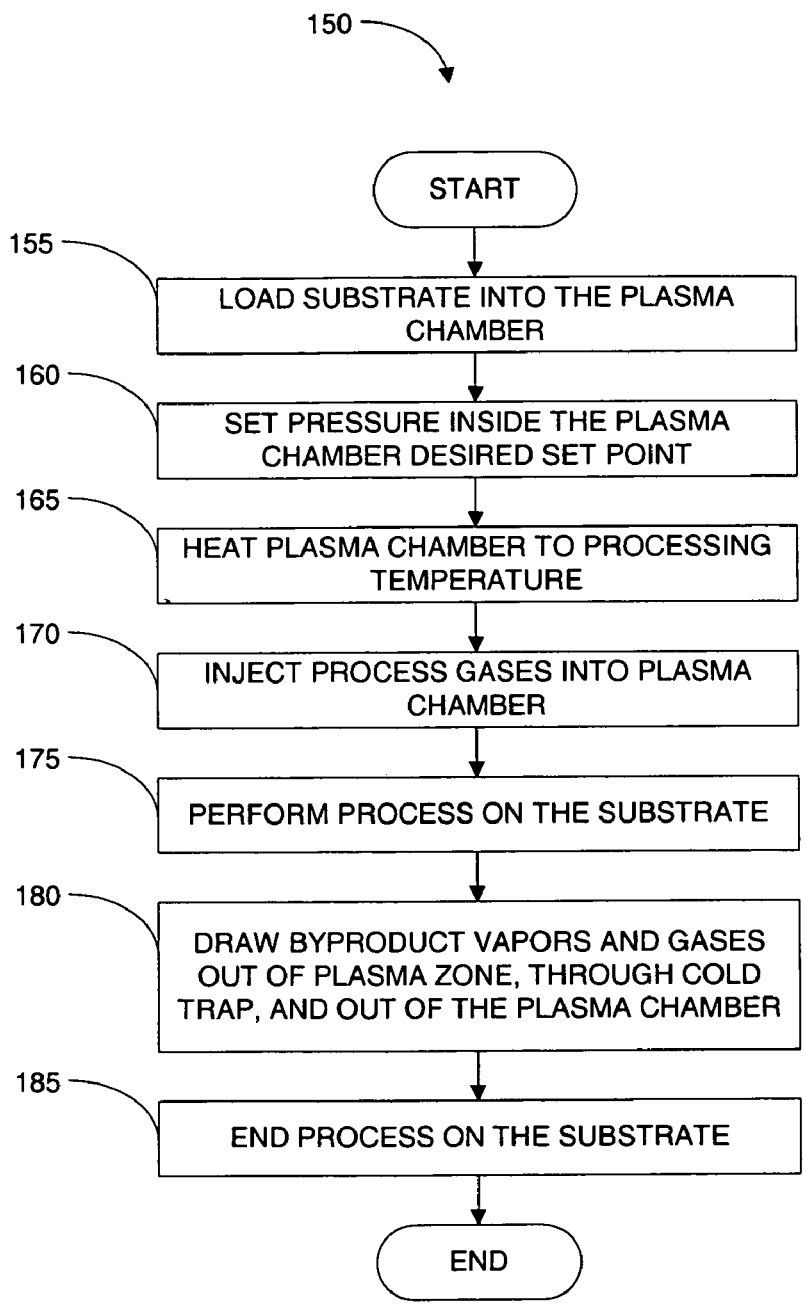
FIG. 1B is a flowchart of the method operations for etching a substrate in the plasma chamber described above, in accordance with one embodiment of the present invention.

FIG. 1B is a flowchart of the method operations 150 for etching a substrate in the plasma chamber 100 described above, in accordance with one embodiment of the present invention. In an operation 155, the substrate is loaded into the plasma chamber 100 (e.g., through the loading port 128). The loading port can also be closed for processing. In an operation 160, a pressure inside the plasma chamber 100 is adjusted to the desired set point as described above.

In an operation 165, the plasma chamber 100 is heated to the required processing temperature. The processing temperature can be any temperature sufficiently high enough to provide sufficient volatility of the desired species. As described above, in a copper etch process using a chlorine containing gaseous etchant species, the processing temperature is about 200 degrees C. or even higher (e.g., about 250 to about 400 degrees C.). If the intended process is an etch process, then all inner surfaces exposed to the plasma zone 114 are heated to the processing temperature. In the alternative, if the intended process is a deposition process, then all inner surfaces exposed to the plasma zone 114, except the substrate 108, are heated to the processing temperature. Heating the inner surfaces to the processing temperature can be accomplished by forming a plasma in the plasma zone 114 or by actively heating the various surfaces with resistive, radiant or other types of thermal energy sources.

In an operation 170, the process gases are injected into the plasma chamber 100 and a etch (or deposition) plasma is formed. In an operation 175, the etching (or deposition) operation is performed. In an etching operation, the etching chemistry etches away a portion of the surface of the substrate 108 that is exposed to the plasma. By way of example, a copper layer can be etched by a chlorine containing species causing CuClx byproducts to be vaporized in the plasma.

In an operation 180, the byproduct vapors and gases are drawn out of the plasma zone 114 and through the cold trap 120 and out of the plasma chamber 100 by the pump(s) 144. At least a portion of the byproduct vapors condense on the relatively cool surfaces of the cold trap 120, as the byproduct vapors are drawn through the cold trap. In this manner substantially all of the particles that may be caused by the condensed byproduct vapors are formed away from the inner surfaces that the substrate 108 is exposed to. As a result, the particle contamination of the substrate 108 is substantially eliminated.

In an operation 185, the etching (or deposition) operation is ended. The etching (or deposition) operation ends when a desired result is achieved. By way of example, the operation ends when an etching time has been achieved or when a desired end point has been achieved. In an operation 240, the substrate 108 is removed from the plasma chamber 100 and the method operations end.

While the above examples are described in terms of copper etch processes with chlorine based etchants, the present invention is not limited to copper etches. By way of example a platinum material could be etched by chlorine and carbon monoxide gases. Other etchant species can include HBr, HI, $BCl_3$ and $CF_4$.

In an alternative embodiment, the chamber 100 shown in FIG. 1A can also be used to perform chemical vapor deposition (CVD). In a CVD operation, the chuck 102 may be cooled heated so that the vapor species will deposit on the substrate 108 mounted on the chuck 102. By way of example, an organic film can be deposited using $C_2H_4$ or $C_2H_2$ as precursors. In another CVD embodiment, a copper film can be deposited either thermally or using plasma assistance on the substrate 108 and inner surfaces. After the substrate 108 is removed from the processing chamber, the copper film on hot inner surface can be cleaned using a chlorine or a bromine containing etchant.

The plasma chamber 100 can be used to perform a stress free planarization as described in co-owned and co-pending U.S. patent application Ser. No. 10/390,520 filed on Mar. 14, 2003 and entitled "System, Method and Apparatus for Improved Local Dual-Damascene Planarization," and U.S. patent application Ser. No. 10/390,117 filed on Mar. 14, 2003, and entitled "System, Method and Apparatus for Improved Global Dual-Damascene Planarization." Both applications are incorporated herein by reference in their entirety for all purposes.

Figure 2A:
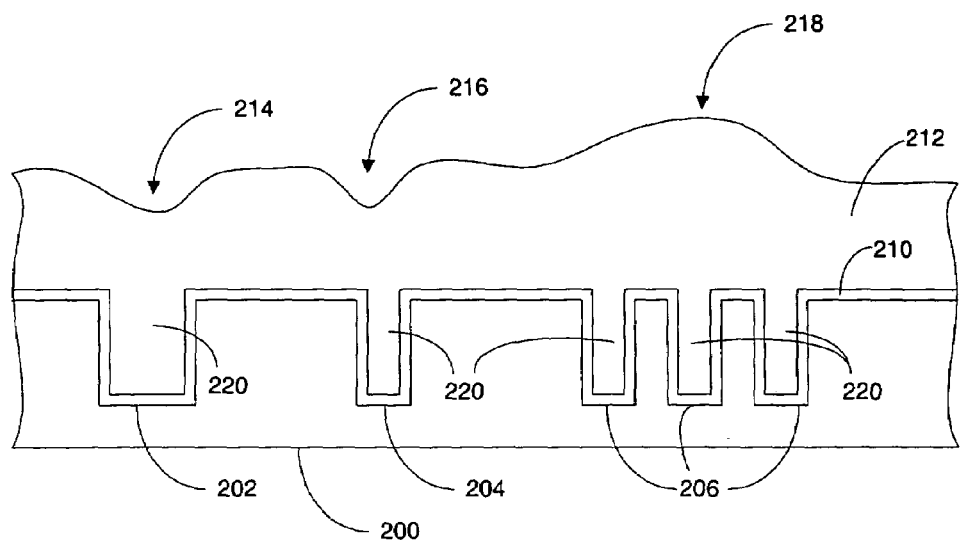
FIG. 2A shows a patterned semiconductor substrate in a dual damascene process in accordance with one embodiment of the present invention.

FIG. 2A shows a patterned semiconductor substrate 200 in a dual damascene process in accordance with one embodiment of the present invention. The substrate 200 has been patterned as part of the semiconductor manufacturing process such as a dual damascene manufacturing process. A mask can be used to pattern the substrate 200. The substrate 200 includes a large, somewhat isolated feature 202 (e.g., trench, via, etc.) a smaller, somewhat isolated feature 204 and several features 206 that are densely packed together. A barrier layer 210 is also included. The barrier layer 210 is typically a different material than the substrate 200 or a conductive interconnect material 220. The conductive interconnect material 220 can be copper or copper alloy or other conductive material.

An overburden portion 212 of the conductive interconnect material 220 extends above the features 202, 204, 206 and includes corresponding localized variations 214, 216, 218 in thickness of the overburden portion 212. As shown, the larger feature 202 has a corresponding larger decrease in the thickness of the overburden portion 212 as compared to the smaller feature 204, which has a slightly smaller variation in thickness of the overburden portion 212. The densely packed features 206 have a somewhat increased thickness of the overburden portion 212.

Typical etch processes etch the overburden portion 212 of the conductive interconnect material 220 at a fairly uniform rate over the entire wafer area and therefore the typical etching process will expose the barrier layer 210 near the large feature 202 before the barrier layer 210 near the densely packed features 206 will be exposed. In sum, the typical etching process cannot planarize the overburden portion 212 of the conductive interconnect material.

Figure 2B:
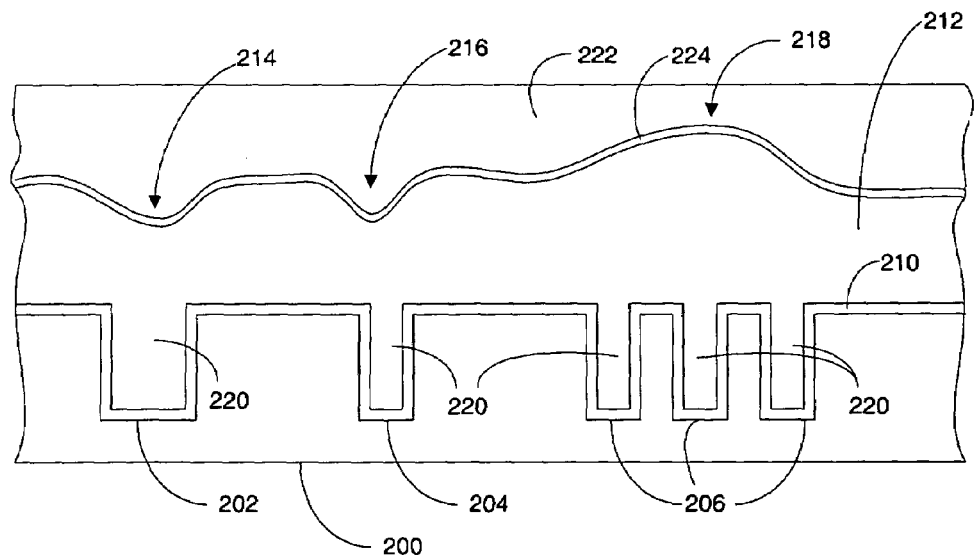
FIG. 2B shows an additional layer added in accordance with one embodiment of the present invention.

FIG. 2B shows an additional layer 222 added in accordance with one embodiment of the present invention. The additional layer 222 is formed on top of the overburden portion 212. The additional layer 222 can be a substantially planar fill material (e.g., spin on glass (SOG), polysilicon, polymer resist, bilayer, UV or thermally curable material, or other material that can flow to form a planar surface and which has the appropriate etching characteristics). An optional, relatively thin (e.g., about 25–100 nm in thickness) conformal layer 224 may also be included between the additional layer 222 and the overburden portion 212. The conformal layer 224 can be a barrier layer or an adhesion layer. The conformal layer 224 can allow a wider variety of materials that can be used for the additional layer 222.

The additional layer 222 and the overburden portion 212 have a substantially 1:1 etch selectivity so that a subsequent etching process (e.g., plasma or gaseous etch process) can etch both the additional layer 222 and the overburden portion 212 at substantially the same rate.

Figure 3:
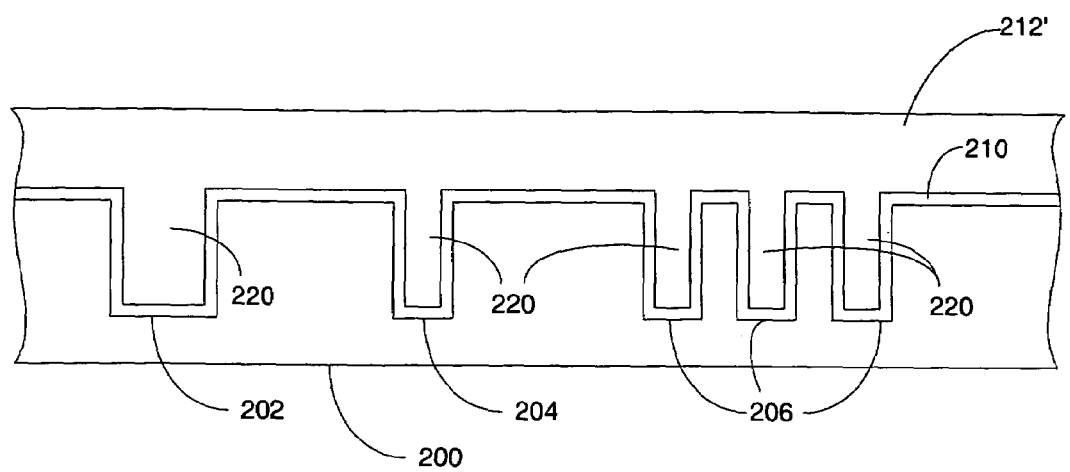
FIG. 3 shows a substantially planar overburden portion in accordance with one embodiment of the present invention.

FIG. 3 shows a substantially planar overburden portion 212' in accordance with one embodiment of the present invention. Because the additional layer 202 forms a substantially planar surface over the stack of layers 200, 210, 212, 222, a first etching process can uniformly etch the additional layer 222 and the overburden 212 over the entire area until the remaining overburden portion 212' is substantially locally planar in that the local variations 214, 216, 218 are substantially eliminated.

A typical recipe would involve conditions that provide a 1:1 etch selectivity between the additional layer 222 and the overburden portion 212. By way of example, if the additional layer 222 is SOG, and the overburden portion 212 is copper, then a halogen (e.g., Cl, F, Br, I) based chemistry provides etch rate control for both the SOG as well as copper to allow for tuning for the desired 1:1 selectivity. Although any plasma feed gas producing reactive halogen radicals can be used, CF4, Cl2, and HCl are typical examples. Various process parameters can be adjusted to control etch rates, selectivity, uniformity and reduce corrosion include variation of process variables such as substrate temperature and inclusion of one or more additives (e.g., Ar, H2, Cl, O2, CH3X (X=F, Cl, Br, I), CH2F2, and CH4).

Another approach involves a sputter dominant etch with Ar or other inert gas such as He, Xe, Ne, Kr, as the primary etchant of the copper overburden portion 212 with other additives to provide etch rate control of the additional layer 222 and passivation of the top surface of the remaining copper 212. The other additives can include, for example H2 and/or CF4. Either of these processes is can operate over a wide temperature range of between about 75 degrees C. and about 400 degrees C.

The first etching process is an etch process designed to leave the remaining overburden portion 212' substantially locally planar in that the local variations 214, 216, 218 are substantially eliminated. One or more subsequent etching processes will remove the bulk or the majority of the overburden portion 212'. A finish etching process can be applied to continue the etching process to an endpoint at which the overburden portion 212' is removed from the barrier 210. The finish etching process can also be included in the bulk etch process. Subsequent processes after the finish etch can include selective barrier removal and passivating the remaining conductive material 220 to prevent corrosion and provide stability for further processing. An additional operation after the finish etch can be designed not to significantly remove any material but only passivate the remaining conductive material 220 to prevent corrosion and provide stability for further processing.

Figure 4A:
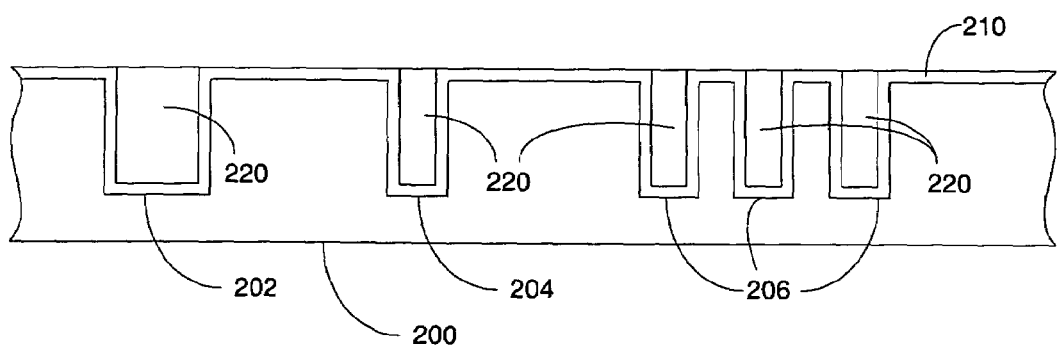
FIG. 4A shows the substrate having undergone a second etching process in accordance with one embodiment of the present invention.

FIG. 4A shows the substrate 200 having undergone a second etching process in accordance with one embodiment of the present invention. The second etching process continues to an endpoint such that the barrier layer 210 will be exposed at all locations substantially simultaneously and leaving only the portion 220 of the conductive material (e.g., copper, copper-containing alloys and combinations, and other conductive material) that fills the features 202, 204, 206.

The first etching process and the second etching process can be substantially similar or significantly different. By way of example, the first etching process can be an etching process for improving the local planarity of the overburden portion 212 due to local non-uniformities 214, 216, 218 (e.g., caused by feature 202, 204, 206 locations, sizes and concentrations in underlying layers). The entire additional layer 222 and a portion of the overburden portion 212 can be removed in the first etching process. By comparison, the second etching process can be a much more selective etching process that removes the bulk of the remaining, planar overburden 212' to the endpoint (i.e., when the barrier layer 210 is exposed).

Figure 4B:
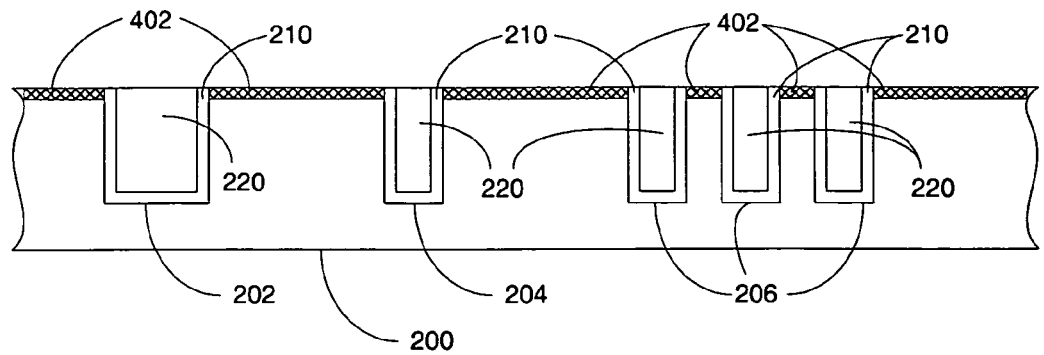
FIG. 4B shows the substrate having undergone a barrier removal process in accordance with one embodiment of the present invention.

FIG. 4B shows the substrate having undergone a barrier removal process in accordance with one embodiment of the present invention. A portion of the barrier layer 210 is removed to expose an underlying mask layer 402. Only the portion of the barrier layer 210 that is formed within the features 202, 204, 206 remain. A typical second etching process removes the bulk portion of the overburden 212 at high rate and preferably with a high selectivity to the barrier layer 210. By way of example, if the overburden portion 212 is copper, a halogen—based chemistry (e.g., Cl2, CF4, HCl, HBr, BCl3) can be effectively used for the second etching process. In another approach a physically dominant etch process such as an Ar (or other noble or inert gas) based sputter process can be used. Various process parameters can be adjusted to control etch rates and selectivity. The various process parameters can include adjusting process variables such as substrate temperature balance of reactive species, and inclusion of one or more additives (e.g., H2, O2, Ar, He, Xe, Ne, Kr, etc.).

Figure 5:
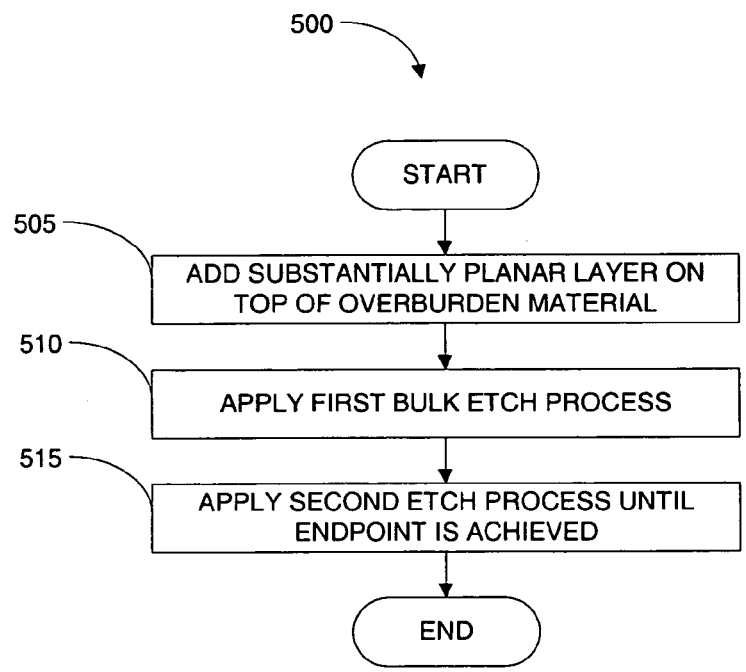
FIG. 5 is a flowchart of the method operations of performing a local planarization, in accordance with one embodiment of the present invention.

FIG. 5 is a flowchart 500 of the method operations of performing a local planarization, in accordance with one embodiment of the present invention. In operation 505, the additional layer 222 is added on top of the conductive overburden portion 212. In operation 510, the first etch process is applied to remove the majority of the additional layer 222 and the conductive overburden portion 212. In operation 515, the second etch process is applied to remove the remaining overburden portion 212' to the endpoint.

In an alternative embodiment, operation 515 can also include a finish etch process as described above. Subsequent processes after the finish etch can include selective barrier removal and passivating the remaining conductive material 120 to prevent corrosion and provide stability for further processing. An additional operation after the finish etch process can be designed not to significantly remove any material but only passivate the remaining conductive material 220 to prevent corrosion and provide stability for further processing.

Figure 6A:
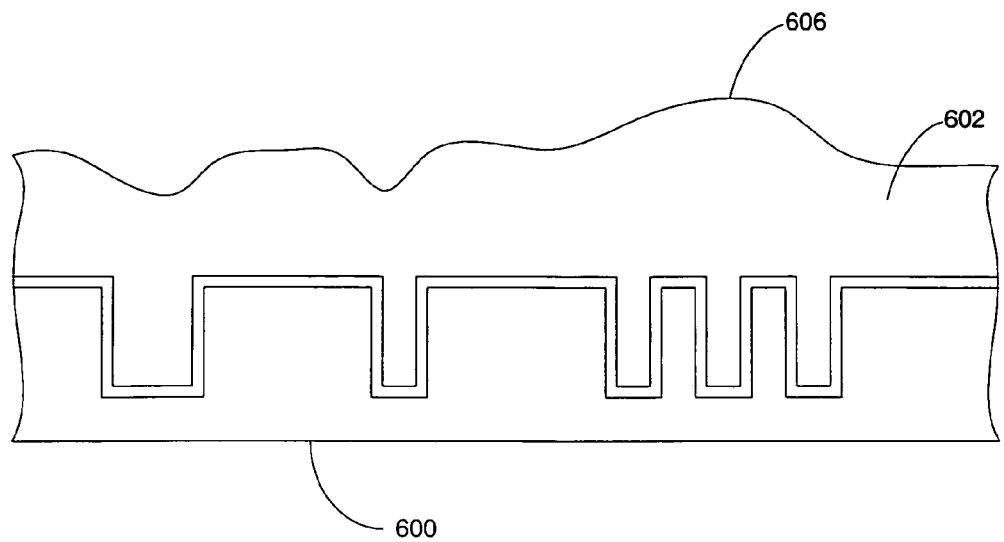
FIGS. 6A–6D show a sequence of chemical conversion and etch-back processes applied to a substrate to increase local uniformity, in accordance with one embodiment of the present invention.

FIGS. 6A–6D show a sequence of chemical conversion and etch-back processes applied to a substrate 600 to increase local uniformity, in accordance with one embodiment of the present invention. FIG. 7 is a flowchart 700 of the method operations of the chemical conversion and etch-back processes applied to a substrate 600 to increase local uniformity, in accordance with one embodiment of the present invention. As shown in FIG. 6A, the substrate 600 has a substantially non-planar overburden portion 602 with non-planar surface profile 606, similar to the substrate 100 described in FIG. 2A above.

Figure 6B:
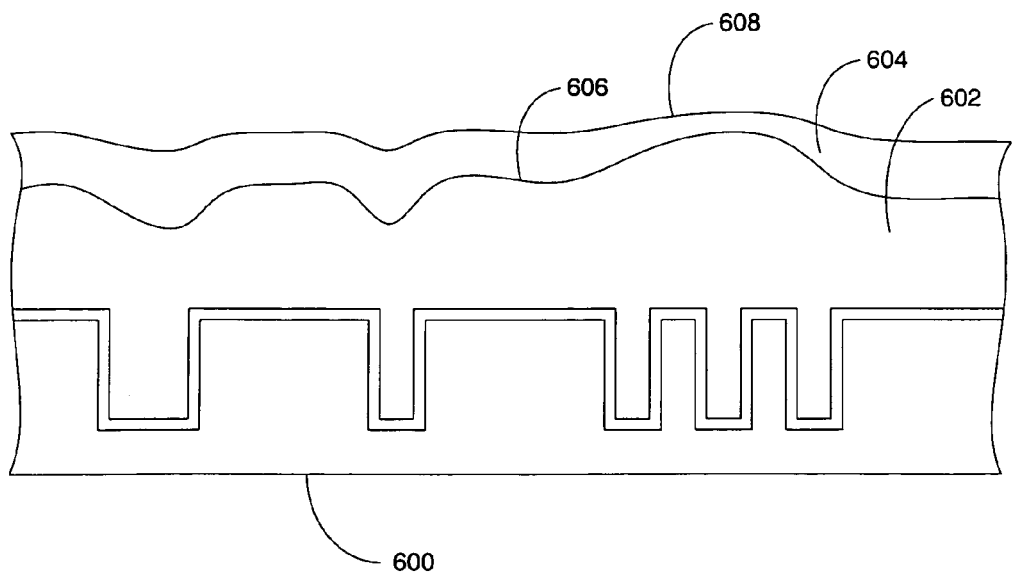
Figure 7:
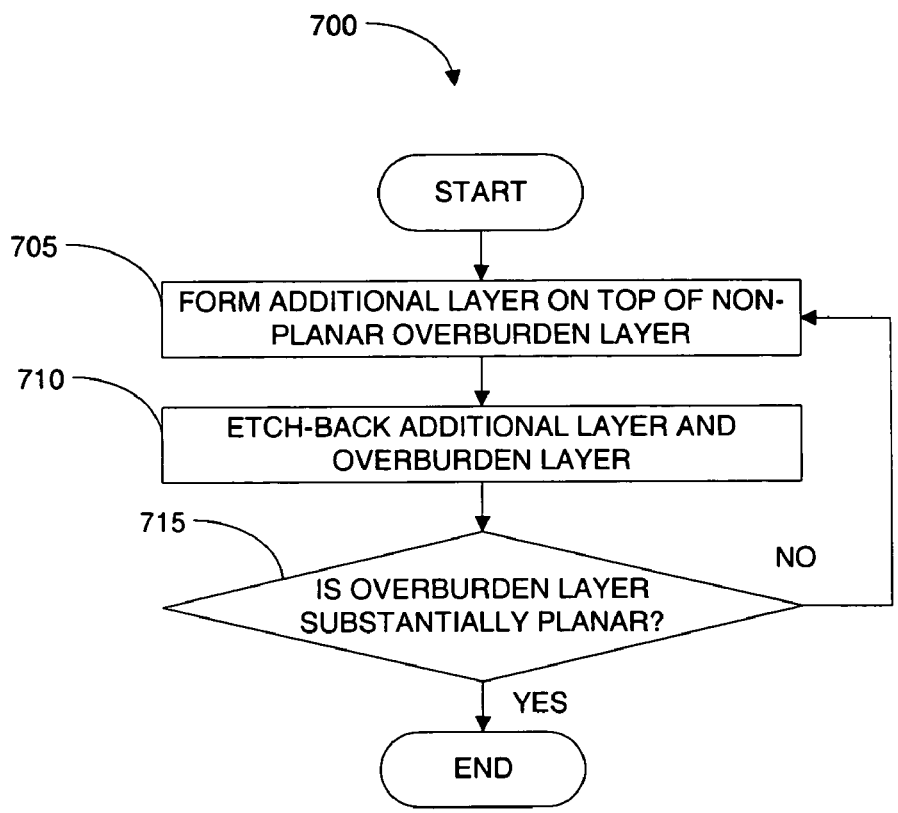
FIG. 7 is a flowchart of the method operations of the chemical conversion and etch-back processes applied to a substrate to increase local uniformity, in accordance with one embodiment of the present invention

Referring now to FIGS. 6B and 7, in operation 705, an additional layer 604 is formed on top of the overburden portion 602. The additional layer 604 may be deposited or formed on the overburden portion 602. By way of example, the additional layer 604 can be formed through a chemical conversion of a top-most portion of the overburden portion 602. If the overburden portion 602 is copper or copper alloy, then a controlled exposure to a gas can form a copper reaction product layer 604. One example is a halogen gas that can form a Cu-halide layer 604. The copper reactant layer 604 diffuses into the surface of the copper overburden 602 to convert a top portion of the copper overburden 602. Processes for chemical conversion of copper are known in the art, such as Nagraj S. Kulkarni and Robert T. DeHoff, "Application of Volatility Diagrams for Low Temperature, Dry Etching, and Planarization of Copper", Journal of Electrochemical Society, 149 (11) G620–G632, 2002.

In another example, the additional layer 604 can be deposited on the overburden portion 602. The deposited layer 604 can include a polymer layer or an oxide layer being deposited on the overburden portion 602.

Figure 6C:
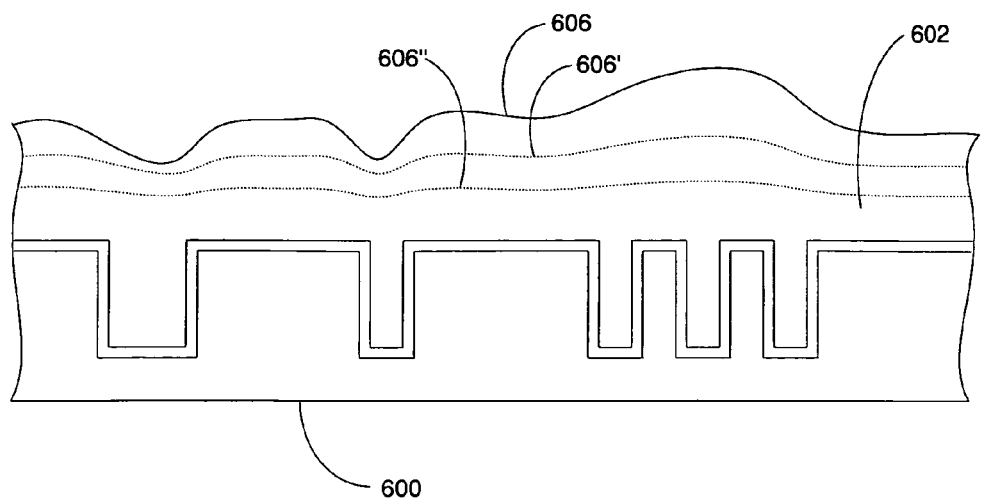
Figure 6D:
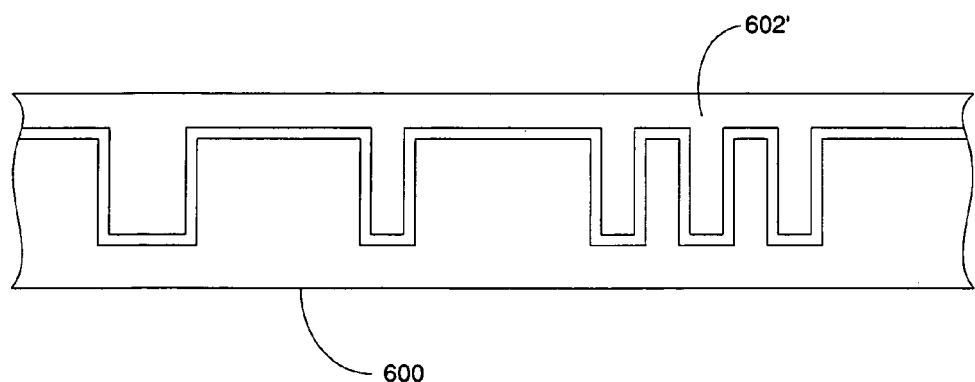

Referring now to operation 710 and FIG. 6C, an etch-back process is applied to remove the additional layer 604. A portion of the overburden portion 602 may also be removed. Removing the additional layer 604 results in further softening (i.e., planarizing) of the profile of the overburden portion 602 to profile 606'. The Cu-halide substantially softens the contours of the overburden portion 602. A Cu-halide can also maintain a substantially 1:1 etch-back selectivity with the copper overburden portion 602. Operations 705 and 710 can be repeated multiple times to substantially planarize the overburden portion 602 to subsequent profiles 606' and 606", as shown in FIG. 6D, until the resulting profile is substantially planar.

Chemical conversion of copper overburden portion 602 utilizing shape dependence of compound formation can be typically achieved by oxidizing the copper at the Cu-reactive species interface. Copper oxidization in this instance can include a chemical conversion of elemental copper to a copper compound with copper in a positive oxidation state. By way of example, oxidation of the copper to cuprous- or cupric chloride (CuCl or CuCl2) at the surface can occur in a chlorine plasma at lower temperatures (e.g.,<200 degrees C.).

The etch-back process involves reduction of this copper compound to another chemical compound capable of being volatile and thus leaving the surface of the remaining overburden 602' at the fixed substrate temperature. By way of example, there can be a reduction of the CuCl2 to volatile Cu3Cl3 in the presence of reactive hydrogen species (e.g., H2 plasma). Alternating the shape-dependent conversion followed by etch-back of the converted portion can lead to bulk removal of the copper overburden portion 602, while simultaneously planarizing the topography (e.g., profile) of the copper overburden 602.

In operation 715, if the overburden portion 602 is substantially planarized, then the method operations end. Alternatively, if in operation 715, the overburden portion 602 is not substantially planarized, then the method operations continue at operation 705 above. In one embodiment, operations 705–715 can occur in situ within a single etch chamber. In an alternative embodiment, operation 710 can occur ex situ and can include ECD or low-down force CMP processes to achieve the substantially planar overburden portion 602' as shown in FIG. 6D.

The method operations described in FIGS. 6A–7 can be used as a planar bulk removal process that performs both planarization of the non-planar overburden portion 602 and removal of the bulk of the overburden portion 602.

The local planarization of the substrates 200, 600 can be determined through any one or more of several known layer thickness mapping technologies that are known in the art. By way of example, an eddy current sensor can map the thickness of the overburden portion 212, 212' as described in commonly owned U.S. patent application Ser. No. 10/328, 912 entitled System, Method And Apparatus For Thin-Film Substrate Signal Separation Using Eddy Current by Gotkis et al., filed on Dec. 23, 2002 and U.S. patent application Ser. No. 10/251,033 entitled System And Method For Metal Residue Detection And Mapping Within A Multi-Step Sequence by Gotkis et al., filed on Sep. 19, 2002, which are incorporated by reference herein, in their entirety.

The methods and systems described in FIGS. 2A–7 above describe various approaches to substantially eliminating local, pattern dependant non-uniformities in an overburden portion. However, methods and systems described in FIGS. 2A–7 above do not directly address correction of global non-uniformities. Global non-uniformities can include variations in removal rates of material in the center of the substrate as compared to the edge of the substrate and other non-uniformities that are not localized phenomena.

Figure 8:
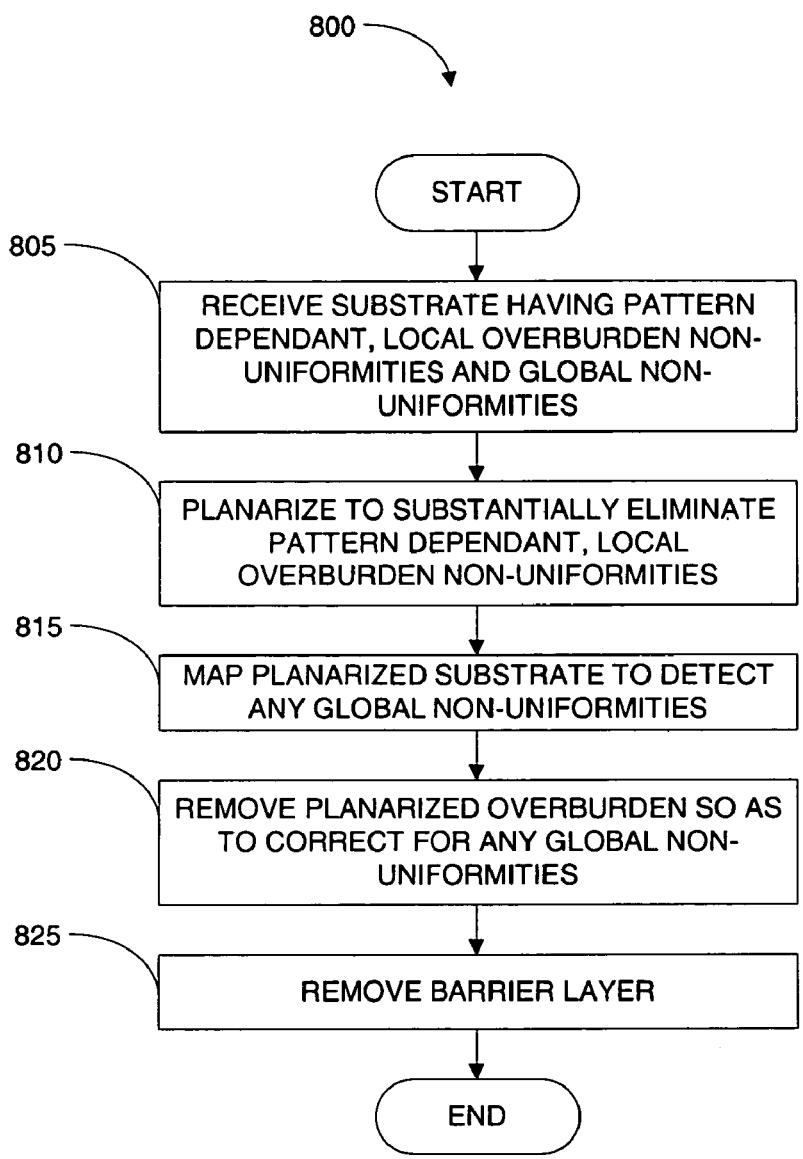
FIG. 8 is a flowchart of the method operation of correcting global non-uniformities in accordance with one embodiment of the present invention.

FIG. 8 is a flowchart of the method operation 800 of correcting global non-uniformities in accordance with one embodiment of the present invention. In operation 805, a substrate having localized non-uniformities such as feature-pattern dependant non-uniformities in the overburden portion is received. In operation 810, the localized non-uniformities are substantially eliminated such as through CMP, ECP or the methods and systems described in FIGS. 2A–7 above or any other method known in the art. Substantially removing the localized non-uniformities forms a substantially, locally planarized overburden portion such as the planarized overburden portion 212' shown in FIG. 3 above.

Figure 9:
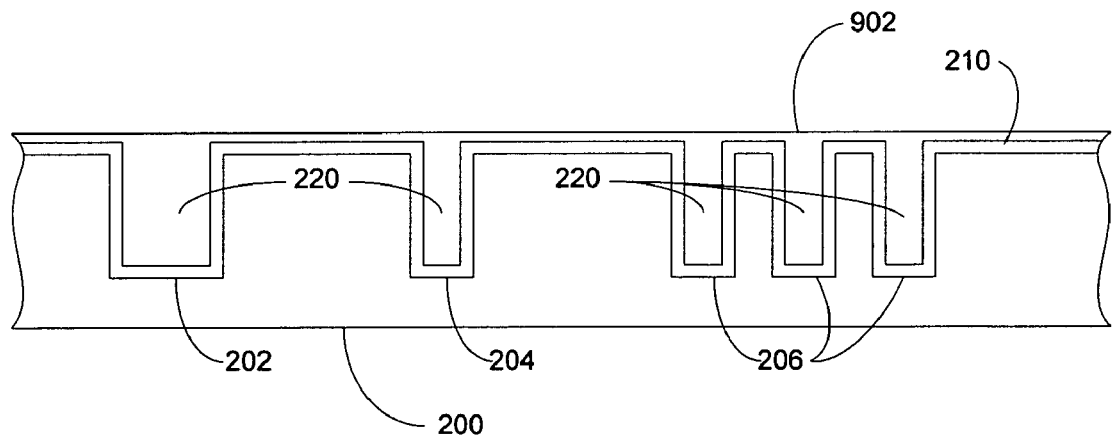
FIG. 9 shows a substantially removed, planarized overburden portion in accordance with one embodiment of the present invention.

FIG. 9 shows a substantially removed, planarized overburden portion 902 in accordance with one embodiment of the present invention. The substantially removed, planarized overburden portion 902 can be a relatively thin overburden portion such as a few hundred angstroms in thickness.

In operation 815, the substrate with the planarized overburden portion is mapped to identify and quantify any global non-uniformities in the planarized overburden portion. The planarized overburden portion can be mapped with any one or more of several known layer thickness mapping technologies that are known in the art as described above. The mapping can be in situ (within the current process chamber) or ex situ (external to the current process chamber). An in situ mapping process can also be dynamic and allow for the subsequent processes to be dynamically adjusted as the subsequent processes progress.

In operation 820, the location and quantity of the global non-uniformities, as determined in operation 815 above, are removed in a substantially mechanical stress-free process by adjusting an etching process to address the specific requirements of the detected global non-uniformities in a finish etch process. By way of example, if the remaining overburden portion 902 were approximately 500 angstroms thick in the center and 300 angstroms thick on the edge, then the recipe can be adjusted such that the center to edge non-uniformity can be compensated for so that the entire barrier layer 210 will be exposed simultaneously. The stress-free process avoids the CMP problems described above because no mechanical force is applied to the substrate during the etch-back process.

The recipe (e.g., selected values of process variables) that is selected is selective to barrier layer 210 (i.e., will etch the barrier at a much slower rate than the recipe will etch the copper, e.g., a typical selectivity range of copper etch over barrier etch in these processes is greater than about 1 but less than about 3) and that will minimize any recesses (e.g., excess removal of the conductive material 120 in the features 202, 204, 206).

The finish etch can have relatively slow etch rates for both copper of the remaining overburden portion 902 and the barrier layer 210 to minimize any recess into the features 202, 204, 206 with respect to the remaining height barrier of the barrier layer 210. As a result, the finish etch cannot have a very high selectivity to etch the copper.

A final etch-back process can also be included. The final etch-back process includes etch-back of the mask material and/or the ILD material with appropriate selectivity and uniformity control such that the final outcome provides substantially globally uniform and substantially planar features with minimal copper and IL loss (e.g., any copper recess is globally uniform across the substrate 200 at the end of the final etch and barrier removal processes). In this instance, the final etch would include a uniform process to etch-back the mask material with high selectivity to minimize copper loss and minimize the copper recess. By way of example, a halogen-based process where the halogen concentration is low and the substrate temperature is low (e.g., less than about 200 degrees C.) will maintain a low copper etch rate while still sufficiently chemically etching the mask material. Any plasma feed gas including halogen reactive species (e.g., CF4, C2F6, C4F6) can be used. Etch rate control additives can include Ar, O2, CH2F2 and others can also be included.

If the global copper recess and/or mask/ILD loss are non-uniform across the substrate at the end of the finish etch and final etch-back process, then additional variations in the recipe must be taken to correct for the global non-uniformities. By way of example, typical instances are a result of etch non-uniformity are described as center fast or edge fast etch rates. In either of these instances, can result in a variation in copper recess and/or mask/ILD loss across the substrate. Compensation can be achieved to counter this variation to obtain globally planar features with minimal copper and mask loss utilizing appropriate uniformity and selectivity controls during the final etch-back of the mask/ILD material. In the instance of a center-fast finish etch process resulting in larger copper recess in the center of the substrate can be compensated for by an edge-fast final etch back process which selectively etches the mask material to bring to the same level as the copper level in the features 202, 204, 206. Typical selectivity obtained in this process is greater than about 2. Variations of the recipe to provide for uniformity control include pressure, temperature variation across substrate, ion flux uniformity controls, gas concentrations and chamber wall temperature. Variations to control selectivity include reactive halogen species concentration, substrate temperature, and bias power.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in any of the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A small volume plasma chamber comprising:
    a first electrode, the first electrode forming a chuck for supporting a substrate;
    a second electrode, the second electrode being deposed substantially parallel to the first electrode, the first electrode and second electrode being separated by a predetermined distance; and
    a hot liner, wherein the hot liner and the second electrode form a portion of a plurality of inner surfaces to define a plasma zone, the hot liner having a temperature sufficient to substantially prevent deposition on the hot liner.

2. The small volume plasma chamber of claim 1, wherein the predetermined distance is equal to a range of between about 0.5 cm and about 5 cm.

3. The small volume plasma chamber of claim 1, further comprising a cold trap, the cold trap being sufficiently cooler than the plurality of inner surfaces that define the plasma zone to substantially cause a plasma byproduct vapor to condense in the cold trap, the cold trap being coupled to the plasma zone by a passage through the hot liner.

4. The small volume plasma chamber of claim 3, wherein the passage through the hot liner is between about 5 mm and about 20 mm.

5. The small volume plasma chamber of claim 1, wherein the hot liner is manufactured from a substantially plasma resistant material.

6. The small volume plasma chamber of claim 1, wherein the first electrode, the second electrode and the hot liner have a temperature equal to or greater than a processing temperature greater than about 200 degrees C.

7. The small volume plasma chamber of claim 6, wherein the cold trap as a temperature is not less than about 50 degrees C. cooler than the processing temperature.

* * * * *